(12) United States Patent
Smith

(10) Patent No.: US 6,794,942 B2
(45) Date of Patent: Sep. 21, 2004

(54) ELECTRICAL CIRCUITS

(75) Inventor: Alec Smith, Tewksbury (GB)

(73) Assignee: Smiths Group PLC, London (GB)

( * ) Notice: Subject to any disclaimer, the term of this patent is extended or adjusted under 35 U.S.C. 154(b) by 9 days.

(21) Appl. No.: 10/255,933

(22) Filed: Sep. 27, 2002

(65) Prior Publication Data

US 2003/0062952 A1 Apr. 3, 2003

(30) Foreign Application Priority Data

Sep. 29, 2001 (GB) .............................. 0123441

(51) Int. Cl.$^7$ ................................. H03F 3/18

(52) U.S. Cl. ..................... 330/264; 330/269; 330/300

(58) Field of Search ................................ 330/263, 264, 330/265, 267, 268, 269, 300

(56) References Cited

U.S. PATENT DOCUMENTS

| 3,803,503 A | | 4/1974 | Greutman |
|---|---|---|---|
| 4,057,764 A | * | 11/1977 | Yokoyama .................. 330/264 |
| 4,128,813 A | * | 12/1978 | Suzuki et al. ............... 330/264 |
| 5,546,048 A | | 8/1996 | Sano et al. |

FOREIGN PATENT DOCUMENTS

GB         2364839 A      2/2002

* cited by examiner

Primary Examiner—Khanh Van Nguyen
(74) Attorney, Agent, or Firm—Connolly Bove Lodge & Hutz LLP; Larry J. Hume, Esq.

(57) ABSTRACT

A power amplifier has a pair of FETs of opposite kinds connected together to form a source/drain circuit connected with an output. A second pair of high speed transistors is connected to the input and forms a collector/emitter circuit connected to the gates of the FETs. Capacitors are connected across the second pair of transistors and the pair of FETs respectively. Opposing current sources connect with the bases of the second pair of transistors via a resistor divider.

6 Claims, 1 Drawing Sheet

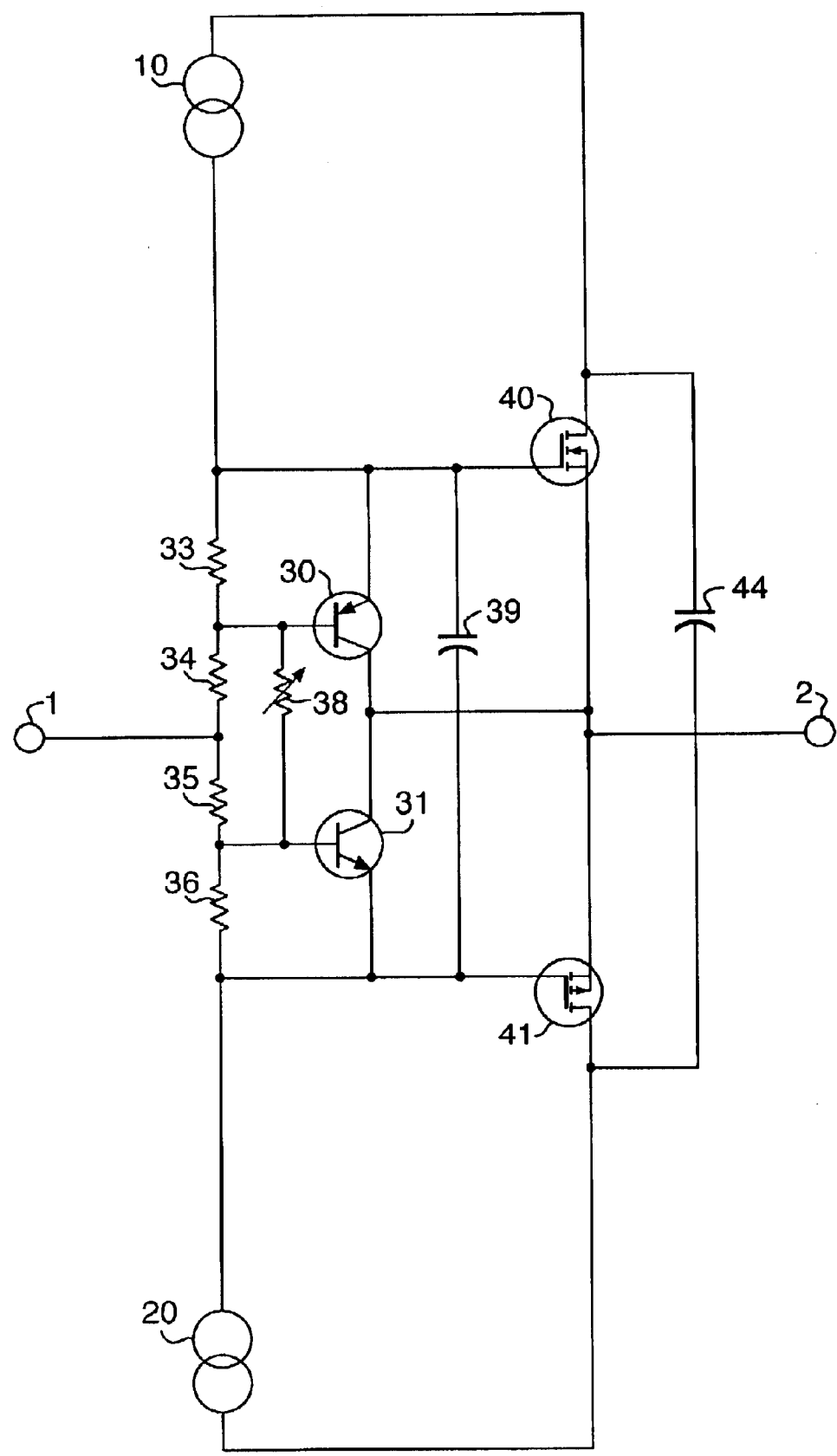

ELECTRICAL CIRCUITS

BACKGROUND OF THE INVENTION

This invention relates to electrical circuits.

The invention is more particularly concerned with power amplifiers.

It can be difficult to produce power amplifiers employing power FETs that can be driven at high slew rates because of the inherent gate-source and gate drain capacitance of such devices. Combined gate capacitance currents may approach 1 A at the highest slew rates demanded. Currents of this magnitude require drivers that insert propagation delays within feedback loops and this gives rise to de-coupling problems.

BRIEF SUMMARY OF THE INVENTION

It is an object of the present invention to provide an alternative power amplifier.

According to the present invention there is provided a power amplifier including a pair of FETs of opposite kind connected together to form a source/drain circuit connected with an output, a second pair of transistors of opposite kinds connected together to form a collector/emitter circuit connected to the gate of respective ones of the FETs, the base of the second pair of transistors being connected to an input, and the amplifier including a capacitor connected between the gates of the two FETs such that when a large current is required one of the transistors of the second pair cuts off and the gate of one of the FETs is driven through said capacitance.

The amplifier may include two opposing current sources connected with respective positive and negative voltage supplies. Each current source preferably includes a transistor with a relatively low base-collector capacitance connected between respective ones of the voltage supplies and the input. The amplifier may include a plurality of resistors connected with said second pair of transistors and arranged such that current is divided substantially equally between the base and emitter of the second pair of transistors. The second pair of transistors is preferably selected to have a high speed and gain.

A power amplifier stage according to the present invention, will now be described, by way of example, with reference to the accompanying drawing.

BRIEF DESCRIPTION OF THE DRAWING

The drawing is a circuit diagram.

DETAILED DESCRIPTION OF THE PREFERRED EMBODIMENT

The circuit has a voltage input 1 and output 2, and two opposing current sources 10 and 20 A pair of two transistors 30 and 31 of opposite polarity are interconnected between the sources 10 and 20 and are connected to the input 1 via resistors 33 to 38. The resistors 33 to 38 are selected so that the current from the current sources is divided approximately equally between the base and emitter of the pair of transistors 30 and 31. Ideally, the resistors 34 and 35 should carry all the base circuit current and should be selected to set the output quiescent current. A capacitor 39 is connected across the emitters of the transistors 30 and 31, the capacitor having a relatively large value compared with the parasitic capacitance of the circuit, typically around 2.2 F.

Two power FETs 40 and 41 of opposite polarity have their sources connected together to the output 2 and their drains connected to respective ones of the sources 10 and 20. A capacitor 44 is connected between the drains of the two FETs the value of the capacitor being relatively large compared with the parasitic capacitance of the circuit, typically around 2.2 F.

In operation, a rising signal applied to the input 1 increases the current through the transistor 31, thereby charging the gate-source capacitance of the FET 41 in a circular route through the collector of transistor 31. Current through the other transistor 30 decreases, thereby allowing the gate-source capacitance of the FET 40 to discharge. The output voltage creates a miller current through the gate-drain capacitance of the FETs 40 and 41, which circulates through the transistors 30 and 31, FET 41, capacitor 44 and FET 40.

If the slew rate is such that the total current exceeds the static current through the emitter circuits of transistors 30 and 31, the transistor 30 will cut off and all the capacitive drive current will flow through the other transistor 31. The gate of the FET 40 will then be driven by the capacitor 39.

In the same way, a falling signal at the input 1 causes the operation to reverse with the transistor 31 cutting off on a fast edge and transistor 30 carrying all the current.

It has been found that such a circuit can produce a flat response from 0 MHz to at least 10 MHz with a 3 A peak output.

What I claim is:

1. A power amplifier comprising:
    an input;
    an output;
    a pair of FETs of opposite kind connected together to form a source/drain circuit connected with said output;
    a second pair of transistors of opposite kinds connected together to form a collector/emitter circuit connected to a gaze of respective ones of said FETs;
    a connection of a base of said second pair of transistors to said input;
    a capacitor, said capacitor being connected between gates of said two FETs such that when a large current is required one of the transistors of said second pair cuts off and the gate of one of said FETs is driven through said capacitance; and
    a plurality of resistors, wherein said resistors are connected with said second pair of transistors and are arranged such that current is divided substantially equally between a base and emitter of said second pair of transistors.

2. A power amplifier according to claim 1, wherein said amplifier includes a positive voltage supply, a negative voltage supply and two opposing current sources connected with respective said positive and negative voltage supplies.

3. A power amplifier according to claim 1, wherein said second pair of transistors is selected to have a high speed and gain.

4. A power amplifier according to claim 1 including a further capacitor connected across said second pair of transistors.

5. A power amplifier comprising:
    an input; an output;
    a pair of FETs of opposite kind connected together to form a source/drain circuit connected with said output;
    a second pair of transistors of opposite kinds connected together to form a collector/emitter circuit connected to a gate of respective ones of said FETs;

a connection of a base of said second pair of transistors to said input; and a capacitor, said capacitor being connected between gates of said two FETs such that when a large current is required one of the transistors of said second pair cuts off and the gate of one of said FETs is driven through said capacitance, wherein said amplifier includes a positive voltage supply, a negative voltage supply and two opposing current sources connected with respective said positive and negative voltage supplies, wherein each said current source includes a transistor with a relatively low base-collector capacitance connected between respective ones of said voltage supplies and said input.

6. A power amplifier comprising:

an input;

an output;

a pair of FETs of opposite kind connected together to form a source/drain circuit connected with said output;

a second pair of transistors of opposite kinds connected together to form a collector/emitter circuit connected to a gate of respective ones of said FETs;

two opposing current sources;

a resistor divider connected between said current sources and said input;

a connection of a base of said second pair of transistors to said resistor divider;

a first capacitor connected across said second pair of transistors; and a second capacitor, said second capacitor being connected between gates of said two FETs such that when a large current is required one of the transistors of said second pair cuts off and the gate of one of said FETs is driven through said capacitance.

* * * * *